United States Patent

Srikantappa

[11] Patent Number: 5,819,062
[45] Date of Patent: Oct. 6, 1998

[54] METHOD FOR CONVERTING DESIGN INTENT INTO A NEUTRAL-FILE-FORMAT FOR COMPUTER AIDED DESIGN APPLICATIONS

[75] Inventor: Ashok B. Srikantappa, Austin, Tex.

[73] Assignee: Motorola Inc., Schaumburg, Ill.

[21] Appl. No.: 349,596

[22] Filed: Dec. 5, 1994

[51] Int. Cl.[6] .............................. G06F 3/00; G06G 15/00; G06E 17/21

[52] U.S. Cl. .......................... 395/500; 395/600; 395/650; 395/140; 395/148; 395/161; 395/155; 364/464.01; 364/512; 364/419.1; 364/419.07

[58] Field of Search ..................... 364/488, 489, 364/490, 491, 578, 523, 512, 464.01, 419.1, 419.07, 408, 419.12, 419.18, 419.19, 188; 395/500, 600, 650, 700, 800, 148, 152, 161, 140, 155, 920, 921

[56] References Cited

U.S. PATENT DOCUMENTS

| | | | |
|---|---|---|---|
| 4,600,996 | 7/1986 | Kawauchi | 364/491 |
| 4,718,025 | 1/1988 | Minor et al. | 395/140 |
| 4,912,657 | 3/1990 | Saxton et al. | 395/155 |
| 5,033,009 | 7/1991 | Dubnoff | 364/523 |
| 5,041,961 | 8/1991 | Inaki | 364/191 |
| 5,083,262 | 1/1992 | Haff, Jr. | 395/500 |
| 5,212,770 | 5/1993 | Smith et al. | 395/155 |
| 5,280,613 | 1/1994 | Chan et al. | 395/700 |
| 5,282,213 | 1/1994 | Leigh et al. | 371/22.1 |
| 5,292,687 | 3/1994 | Isozaki | 437/209 |
| 5,297,241 | 3/1994 | Hirr, Jr. et al. | 395/127 |
| 5,371,675 | 12/1994 | Greif et al. | 364/419.1 |
| 5,381,524 | 1/1995 | Lewis et al. | 395/161 |
| 5,390,320 | 2/1995 | Smithline | 392/500 |
| 5,392,386 | 2/1995 | Chalas | 395/155 |
| 5,394,347 | 2/1995 | Kita et al. | 364/578 |
| 5,461,708 | 10/1995 | Kahn | 395/140 |

OTHER PUBLICATIONS

"Excel 4 for Windows", Martin Matthews, 1992, pp. 41–43, 54–65, 116–117, 158–160, 211–213, 230–231, 238–239, 257, 263–265, 271, 279–285, 329–333.

Primary Examiner—Kevin J. Teska
Assistant Examiner—Jacques Louis-Jacques
Attorney, Agent, or Firm—Bruce E. Hayden

[57] ABSTRACT

A language is defined to describe design information that is readily available in electronic form. The syntax developed is applicable for use in the semiconductor industry, but other terms may be defined that are more appropriate for another use. Using the developed language, designers can describe their design intent in a spreadsheet as an input file. A neutral-format file generator reads this design information and translates the same into DXF output file, an industry standard neutral-file-format, which can be transferred into most CAD systems. All of the steps can be done electronically.

19 Claims, 6 Drawing Sheets

METHOD FOR CONVERTING DESIGN INTENT INTO A NEUTRAL-FILE-FORMAT FOR COMPUTER AIDED DESIGN APPLICATIONS

CROSS-REFERENCE TO RELATED APPLICATION

Related subject matter is disclosed is a pending application Ser. No. 08/321,643 by Wyatt A. Huddleston et al. entitled "Method for Positioning Bond Pads in a Semiconductor Die Layout" filed on Oct. 11, 1994 and assigned to assignee hereof.

MICROFICHE APPENDIX

The computer listing referred to herein as being part of the appendix is included in one (1) microfiche having a total of 18 frames.

The patent document (including Microfiche Appendix) contains material that is subject to copyright protection. The copyright owner has no objection to the facsimile reproduction by anyone of the patent document (including the Microfiche Appendix) as it appears in the Patent and Trademark Office file or records, but otherwise reserves all copyright rights whatsoever.

FIELD OF THE INVENTION

The present invention relates generally to computer aided design, and more specifically to a method for creating a neutral-file-format for computer aided design applications.

BACKGROUND OF THE INVENTION

Typically, when a new drawing design is being created on a computer-aided-design (CAD) system, the design intent or design information is generated on and available in electronic form. The design intent contains coordinate data for creating and positioning specific geometric entities, such as points and lines. This design intent is typically the outcome of a design methodology that has been automated on a computer, and is therefore available in a text file or a spreadsheet. Alternatively, the design information is the outcome of a previous stage in the design process. Often, the design intent or information may not be in a data format that can be read or understood by the particular CAD system being used since the previous design stage may have been done on a different CAD system.

Thus in these situations, in spite of the design information being available electronically, the drawing designer must manually create the geometric entities or drawing features based on the design information available. This manual process can be very time-consuming considering the number of geometric entities involved and that coordinate information is usually specified to the sixth decimal place at the least. Furthermore, this process is a repetitive, non-value-added task that is not worth the time of experienced designers. However, since the task must be done, it increases the overhead cost for the design. This manual method is prone to input errors that cannot be easily checked. These errors can prove very expensive since they usually ripple through to other phases of the design process.

Most CAD systems provide system-specific macro-programming languages which can be used to create geometric entities based on available design information. However, these macro-languages are system dependent and complicated to use. Each CAD system has its own macro-language. A macro-tool developed for use in one CAD system will not work for another.

An example of a drawing currently requiring a manual entering of data is that of a semiconductor chip having bond pads on its die surface. One type of repetitive inputs required during the integrated circuit package design phase is the coordinate data of the locations of the bond pads on the silicon chip. Considering a device having 256 I/Os, the designer must manually draw or define bond pads at 256 locations by specifying the X and Y coordinates of each bond pad location. This repetitive task typically takes a few hours to complete, and the chance of input errors is high.

DETAILED DESCRIPTION OF A PREFERRED EMBODIMENT

Figure 1:
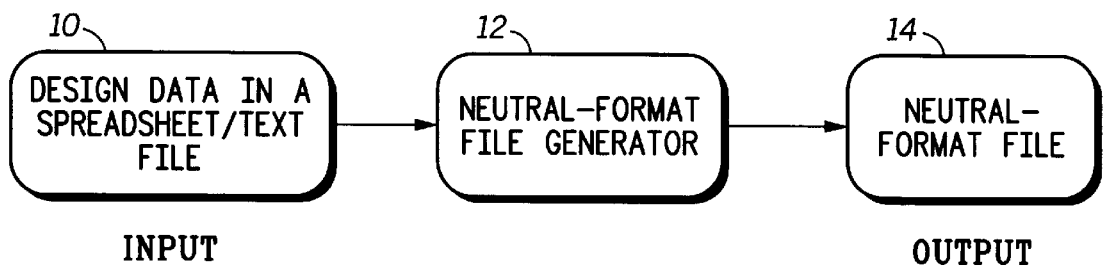
FIG. 1 illustrates, in a flow chart, method steps for converting a design intent file into a neutral-format file, in accordance with the present invention.

The present invention provides (i) a language to describe design information that is readily available in electronic form, and (ii) a system that translates this design information into DXF™, an industry standard neutral-file-format, which can be transferred into most CAD systems. Using the developed language, designers can describe their design intent in a text file or a spreadsheet. The translation system of the invention reads this design information and describes the same in a neutral-file-format text file which can be imported into most CAD systems. One advantage of this system is the reduction in cycle time. A task previously requiring hours to complete can now be performed in a matter of minutes. The gain in cycle time reduction increases as the number of geometric entities increases. Additionally, human input errors are eliminated through the automatic translation system. Furthermore, non-value-added tasks have been eliminated thus allowing more productivity at a lower overhead cost.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

(i) LANGUAGE DEVELOPED TO DESCRIBE DESIGN INTENT

A language is developed to describe the design intent in an electronic file format, as a spreadsheet. Using this language a designer can describe geometric entities or drawing features, such as points, lines, polygons, circles, text, etc. Other geometric entities, such as triangles, ellipses, parallelograms, may likewise be described even though not specifically provided for in this embodiment. The language and its syntax is explained next. Specific geometric entities can be defined by the commands in TABLE 1 which will be hereafter referred to as "entity commands." All parameters listed in TABLE 1 are arabic numbers in the appropriate units where applicable, either English or metric or SI units, except "Group_name" which is text and "String" which is a string of characters.

TABLE 1

Description of entity commands.

| Command Identifier | parameter | parameter | parameter | parameter | parameter |
|---|---|---|---|---|---|
| POINT | X | Y | | | |
| LINE | $X_1$ | $Y_1$ | $X_2$ | $Y_2$ | |
| SQUARE | $X_c$ | $Y_c$ | Length | | |
| CIRCLE | $X_c$ | $Y_c$ | Radius | | |
| DIE | X | Y | | | |
| TEXT | X | Y | text_height | Angle | "String" |
| INSTANCE | Group_name | X | Y | | |

"POINT, X, Y" define a point at a location having the coordinates X and Y.

"LINE, $X_1$, $Y_1$, $X_2$, $Y_2$" define a line whose starting location is at ($X_1$, $Y_1$) and the ending location is at ($X_2$, $Y_2$).

"SQUARE, $X_c$, $Y_c$, Length" define a square whose center is at ($X_c$, $Y_c$) and whose side is "Length" units long.

"CIRCLE, $X_c$, $Y_c$, Radius" define a circle whose center is at ($X_c$, $Y_c$) and whose radius is "Radius" units in magnitude.

"DIE, X, Y" define a polygon that represents a silicon die in the semiconductor device or IC packaging industry, whose width is "X" units, and length is "Y" units.

"TEXT, X, Y, text_height, Angle, String" define a string of text whose starting location is at "(X, Y)", height is "text_height", angle of orientation (in degrees as opposed to radians) is given by "Angle", and whose string to be displayed is given by "String".

Modern CAD systems are able to create a master copy of a defined group of geometric entities. Copies of this master copy of the defined group can be reproduced and placed at several locations in the drawing. The interesting feature is the associative relationship between the master copy and its copies—a change made on the master is reflected in each of its copies. The language used to describe a group, as shown in TABLE 2, is described next.

TABLE 2

Description of group commands.

| Command Identifier | parameter | parameter | parameter | parameter |
|---|---|---|---|---|
| GROUP | group_name | | | |
| entity command | .... | .... | .... | .... |
| entity command | .... | .... | .... | .... |
| entity command | .... | .... | .... | .... |
| ..... | .... | .... | .... | .... |
| ..... | .... | .... | .... | .... |
| GROUP | | | | |

The first line of the "group" command defines its beginning and the group's name. Nested within the group command are intermediate entity commands to define group members. The group comprises one or more member entities. The last line of the group command uses the word GROUP to signal the end of the definition of the group. It is possible to have groups nested within the group command.

Copies of a previously defined group can be reproduced at any location (instanced) in the drawing by the "instance" command (last command in TABLE 1). "INSTANCE, group_name, X, Y" places a copy of the group called "group_name" at a location (X, Y).

(ii) DESCRIPTION OF A SYSTEM TO TRANSLATE DESIGN INFORMATION TO AN INDUSTRY-STANDARD NEUTRAL-FILE-FORMAT

With reference to FIG. 1, the first phase comprises generating an input file or a design intent file 10 using the language explained above to describe the design intent or design information. The design intent file is either a text file or a spreadsheet. The design intent input file 10 is created from a data file which contains parametric design data, such as coordinate information and geometric information of features in a drawing. The data file may have been generated from a previous design phase or from a software tool that computes the data based on optimization routines and a set of design rules. Using a spreadsheet, the design data file is edited or manipulated to express it in the language described above in (i) by adding the appropriate commands of the present invention. Every line of design data in the input file must be expressed by an appropriate entity command. The syntax of the commands may be added to the data file through an electronic insertion of a column, containing the commands, in the far left position of the spreadsheet. The order of the parameters with respect to each command must conform to the order as laid-out in Table 1. Thus, some manipulation or moving around of data may be required, although typically, the data will be specified in the correct order from the previous design step. Alternatively, the designer works on a new spreadsheet/text file and creates a new design using the language described above to define entities and their parameters. The powerful features of a spreadsheet can be taken advantage of to build design rules into the spreadsheet.

The second phase comprises converting the design intent input file into a neutral-file-format output file. After the design intent or input file 10 is generated, the neutral-format file generator system 12 reads it and transfers the information into its database. The method for reading and transferring an input file is explained in detail in FIGS. 2–4.

The neutral-format file generator 12 then translates and writes the design intent file 10 into a neutral-format output file 14. The output file describes all the design information from the input file in DXF™, a neutral file-format, that can be subsequently read into most CAD systems. DXF™ is a Data Interchange Format which is a neutral-file format developed by AutOCAD™, made by Autodesk, Inc., to provide a method for transferring CAD data amongst different CAD software systems. DXF™ is a standard term known and understood by one of ordinary skill in the art. The method for writing the output file is explained in detail in FIGS. 5–7.

Figure 2:
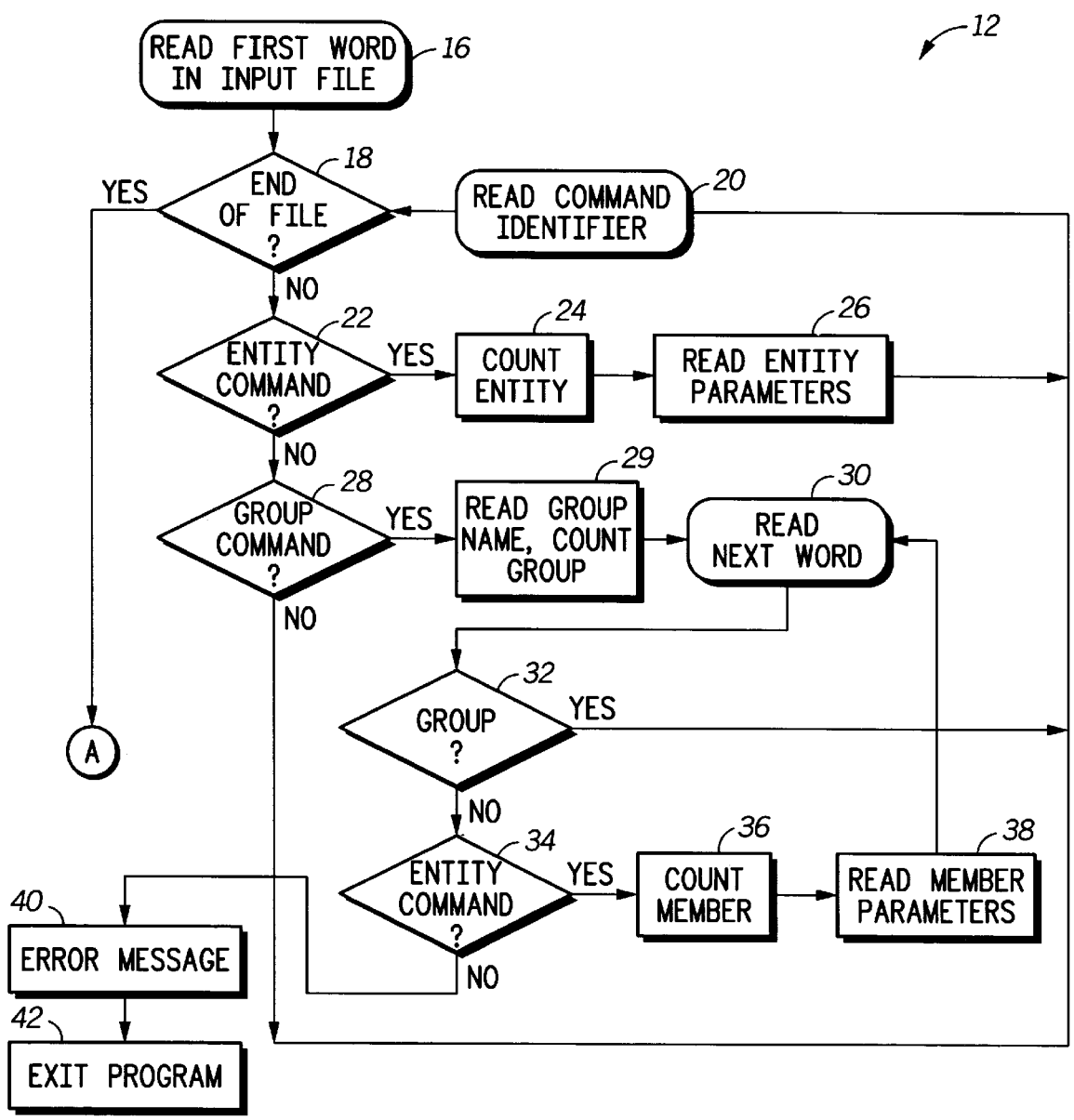
FIG. 2 illustrates, in a flow chart, detailed method steps of the data reading and transferring phase of the neutral-format file generator of FIG. 1.
Figure 5:
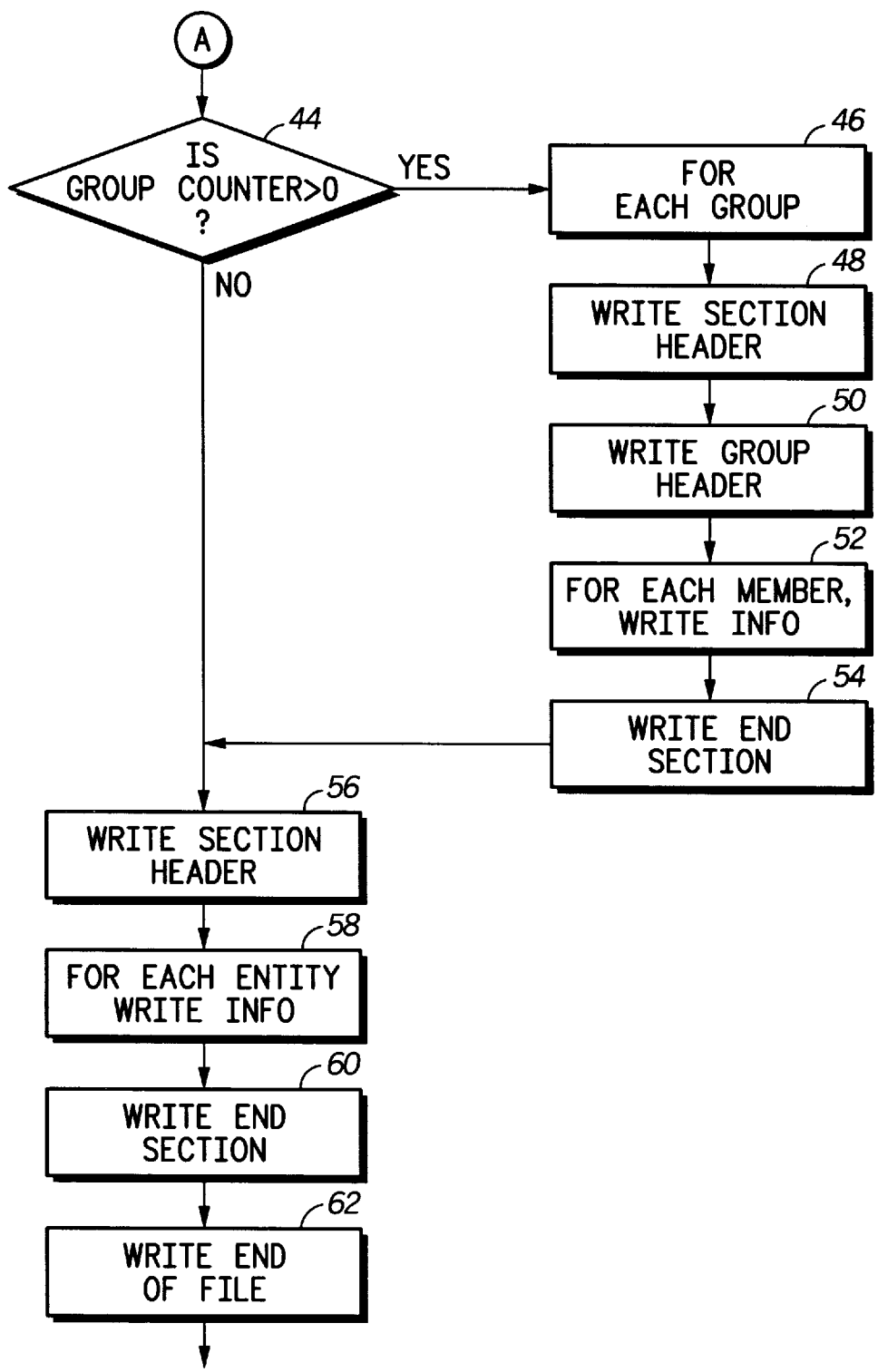
FIG. 5 illustrates, in a flow chart, detailed method steps of the data translating and writing phase of the neutral-format file generator of FIG. 1.

FIGS. 2 and 5 are detailed flowcharts associated with the neutral-format file generator 12 of FIG. 1 to describe the method of reading, transferring, translating, and writing data from the input file into a DXF™ output file. In a first step 16 in FIG. 2, the design intent file or input file is opened for reading of its contents. Once the first text field or text string is read, the program checks if this string is an "End-of-File" indicator in step 18. If it is, the program proceeds to step 44 (illustrated in FIG. 5). If it is not, the program proceeds to step 22 to check if it is one of the command identifiers for an entity command. If there is an entity command identifier match, the program moves to step 24 where it increments a counter that it maintains for each type of entity. After updating the counter, the program then reads the relevant parameters accompanying the entity command in step 26. Once all the parameters on one line of the input file is read, the program then advances to step 20 where it reads the next text field on the next line. Again, it then checks for an "End-of-File" indicator in step 18, and the remaining steps in the loop are repeated.

If the entity command check in-step 22 is negative, the program then checks if the string is a command identifier for a group command in step 28. If it checks negative, it loops back to step 20 to read the next text field/string. However, if it checks positive, it progresses to step 29 where it reads the name of the group and increments the counter maintained for the number of groups defined up to this point. Once the group counter is updated, it then reads the next field/string in step 30. The next step 32 checks to see if the string is the end of group signal, defined as "GROUP" in TABLE 2. If the check is positive, the defined group is completed, and the program loops back to step 20 to read the next command identifier. If the string is not "GROUP" the program moves to step 34 to verify if the string is one of the entity command identifiers. If it is positive, the counter that maintains the number of each type of entity that is part of the defined group is incremented in step 36. Then the program reads the parameters describing the particular entity in step 38. Once the relevant parameters are read, the program loops back to step 30 where it reads the next string. The cycle of steps are then repeated. If verification in step 34 results in a negative, there is an error in the input file as created. Thus, the program displays an error message in step 40, and then exits in step 42. As apparent from this discussion, it is possible to have entity commands nested within the group command. The number and type of nested entity commands depend on the particular group being defined. Additionally, subgroups may also be nested within another group command.

Figure 3:
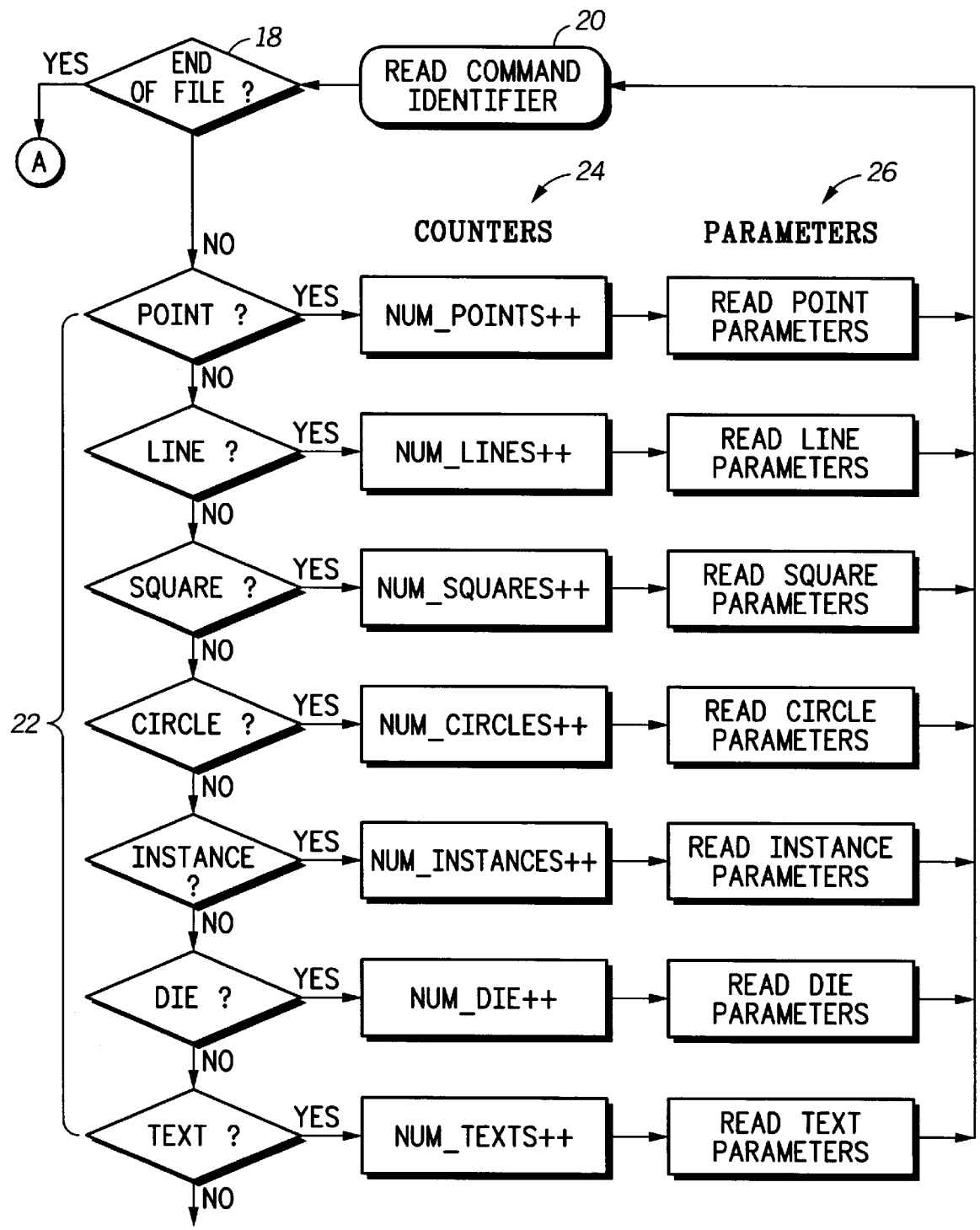
FIG. 3 illustrates, in a flow chart, detailed method steps associated with the "entity" command of FIG. 2.

FIG. 3 illustrates, in a flow chart, detailed method steps associated with the "entity" command of FIG. 2. When the program checks the entity command identifier in step 22, it attempts to match the command identifier with the commands defined in TABLE 1. Operationally, it sequentially or serially compares the string to each of the command identifiers until it finds a match. For example, using the particular syntax defined in TABLE 1, it compares the string to "POINT." If the string does not match "POINT," the program compares the string to "LINE," and so on until a match is made. It should be noted that no particular order of command identifier comparison is required as long as the complete list of identifiers is used. Upon finding a match, the program increments the particular counter maintained for that specific entity type, as shown in expanded counting step 24. The program then reads the corresponding parameters relevant to that entity into its database in step 26.

Figure 4:
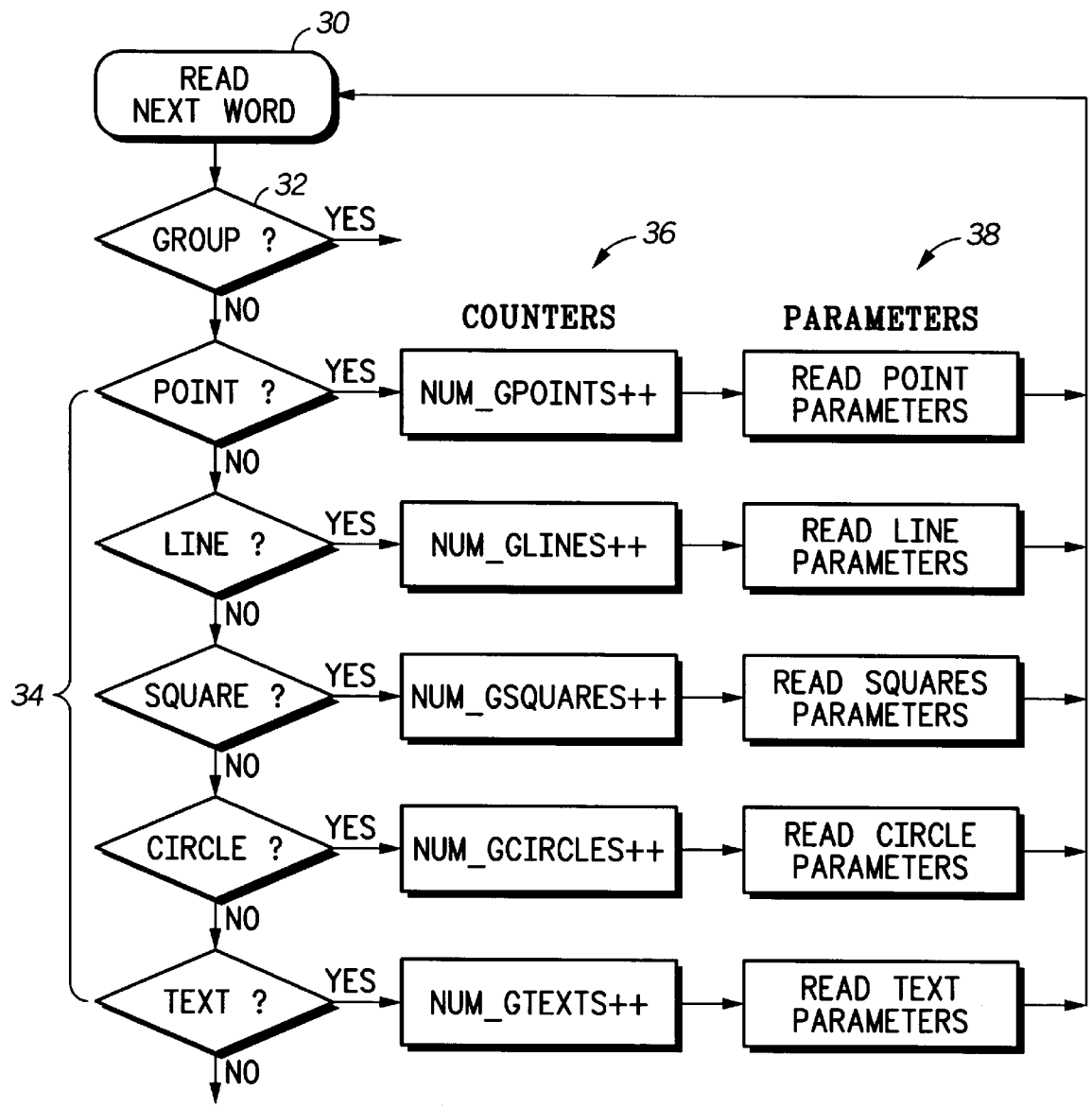
FIG. 4 illustrates, in a flow chart, detailed method steps associated with the "group" command of FIG. 2.

Similarly, FIG. 4 illustrates, in a flow chart, detailed method steps associated with the "group" command of FIG. 2. The program checks the type of entity that is being defined as a member of a particular group in step 34. Fundamentally, the same concept of verification as discussed in FIG. 3 is used. A sequential or serial comparison is performed to match the string to one of the command identifiers. Upon a match, the program in step 36 updates the counter that maintains the number of that type of entity in that particular group. The program then reads the corresponding parameters relevant to that entity into its database in step 38. The next step comprises looping back to step 30 to continue.

The program loops through the flowchart shown in FIG. 2 until the "End-Of-File" indicator is read. At that time, the entire design information has been read and transferred from the design intent file 10 to the database of the neutral-format file generator 12. At this stage the program knows how many different entities exist, all their relevant geometric information, how many groups exist, and all relevant geometric information pertaining to the groups and their member entities. The program then flows to the output phase illustrated in FIG. 5.

The next phase in the generating of the output file 14 is now discussed. The program is ready to create an output file 14 in a neutral file-format that CAD systems understand and will be able to import. FIG. 5 illustrates, in a flow chart, detailed method steps of the data translating and writing phase of the neutral-format file generator 12 of FIG. 1. With reference to FIG. 5, the program first checks its database for any defined groups in step 44. If there is no group defined, the program proceeds immediately to step 56, which will be discussed in more detail later. However, if there are one or more groups in the database found in step 44, the program proceeds first to step 46. It first creates the output file 14 (as illustrated in FIG. 1). Then for each group that is defined in the database, the program loops through steps 48 through 54. It translates the information stored within its database and writes the section header in step 48. The section header contains three lines of text that indicate the beginning of a section as per the neutral file format language. It should be noted that the neutral file format language itself is known to one of ordinary skill in the art. Then in step 50 the program writes the group header in the output file. The group header is a set of lines that contain information pertaining to the group such as the name of the group and its insertion point, again as per the neutral file format language.

Figure 6:
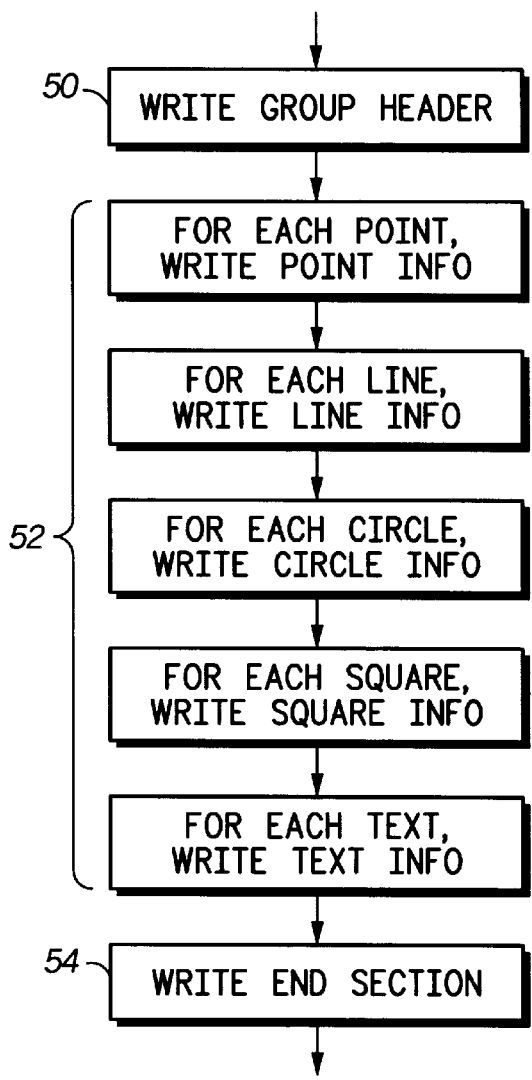
FIG. 6 illustrates, in a flow chart, detailed method steps associated with the writing of member information for each group command of FIG. 5.

The program then proceeds to step 52 of which a detailed flowchart is shown in FIG. 6. For each entity that is a member of the group, a complete description is written in the neutral-file-format language into the output file. This step is detailed in expanded flowchart of FIG. 6, where the program writes all the relevant information of the entities (points, lines, squares, circles, texts) in the output file using the neutral-file-format language. The program then writes a set of lines that indicates the end of a section in step 54. It subsequently loops back to step 46 until all groups information is translated and written into the output file.

Figure 7:
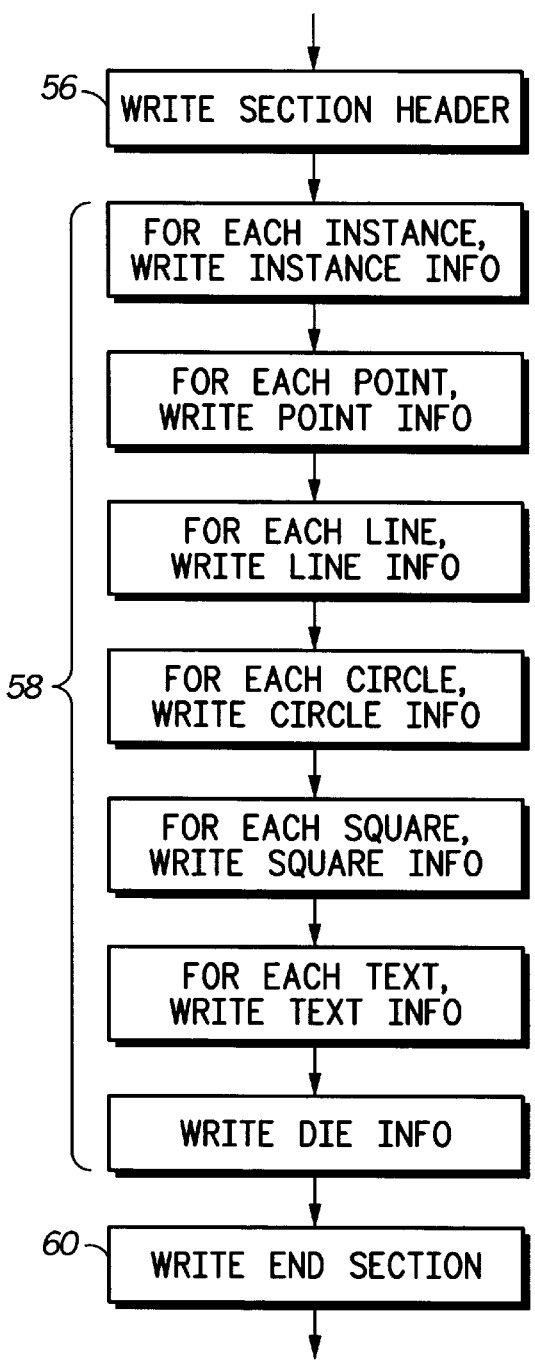
FIG. 7 illustrates, in a flow chart, detailed method steps associated with the writing of entity information for each entity command of FIG. 5.

After writing all the group definitions, if any groups existed, the program proceeds to step 56 where a section header is written in the output file, indicating the beginning of a new section. In step 58, all the information for each entity and for each instance is translated and written in the neutral-file-format language in the output file. A detailed flowchart of step 58 is shown in FIG. 7. First, for each instance of a group, the program writes all relevant information pertaining to the instance in the output file per the neutral-file-format language. The instance information contains a set of lines that describes the name of the group being instanced (copied and placed at various locations) and its location. Then, the program proceeds to write information in the neutral-file-format language for each entity that is defined in the database. The entities it covers are: points, lines, circles, squares, and text strings. Of course, if other entities had been defined in TABLE 1, then this step would write those other entities also. Finally, the neutral-format file generator 12 writes an "end-section" indicating the ending of that section. Having written in a neutral file-format language the definitions of all the groups, all the instances of all the groups, and all the entities, the task of generating an neutral-format output file from an input file in a text or spreadsheet format is completed, and the program is exited. It should be noted that the resulting output file in the neutral-file-format is no longer in a spreadsheet format as the input file was but is rather in a line-item format per the neutral-file-format language.

The above-described method of generating a neutral-file-format has been reduced to practice in a program that can be used in the area of leadframe design. In a specific example, a preceding silicon die design phase has defined the locations of 304 bond pads on the die surface. These defined bond pad locations serve as design inputs in the leadframe design stage. The leadframe designer uses the die design information to perform the following tasks: (i) draw a rectangle representing the die, (ii) draw a group representing the bond pad and consisting of a square with a point in the middle, and (iii) draw copies of the group representing the bond pad placed at the 304 locations whose coordinates are given in a table. Tasks (i) and (ii) can be done quickly on a CAD system, but task (iii) is traditionally very time consuming and can take hours to complete. However, by practicing the present invention, all three tasks require only approximately 5 minutes to complete. Hence, substantial time savings can be realized as well as the elimination of human input errors with the present method.

Practicing the present invention required first the creation of a design intent file based on the bond pad locations information from the previous design stage, which must be available in electronic form. A spreadsheet utility is used to create this input file. Task (i) is accomplished by typing the command "DIE, X, Y" in the first row of the spreadsheet, wherein X and Y are numbers representing the dimensions of the die. This command and accompanying parametric data define a rectangle of width X and length Y. Task (ii) is accomplished by typing the "GROUP" command with a name, for example, "bondpad." The "bondpad group" has a square and a point as its member entities. After the member entities are defined, the end of the group is signaled by typing the word "GROUP" again. Task (iii) is accomplished by copying the X-Y coordinates of the bond pads (available in electronic form) from the design information text file and placing it in the third and fourth columns with the appropriate rows. The first column is filled with the word "INSTANCE" which is a command identifier, and the second column is filled with the name of the group of which copies are to be placed, which in this case is "bondpad." The efficient copying and pasting features of a spreadsheet utility allow this design intent input file to be easily created.

It should be obvious that if the design information is already available in a spreadsheet format electronically, the spreadsheet may be manipulated by adding rows and columns where necessary to achieve the same design intent file layout as described. For example, a first column on the far left may be inserted in the original spreadsheet so as to allow the addition of the command identifiers. A first row may be inserted at the top of the original spreadsheet to allow the addition of the command DIE and the corresponding die dimensions. An example of the syntax used for tasks (i), (ii) and (iii) is shown in TABLE 3. Only the first two lines and the last two lines of task (iii) are shown below to conserve space. Moreover, the terms "task (i)," "task (ii)" "task (iii)" and "(bond pad #n)" do not belong in the design intent file itself but are only shown for illustrative and explanatory purposes.

TABLE 3

Design intent file, 304 bond pads on a die.

| DIE | X | Y | | task (i) |
|---|---|---|---|---|
| GROUP | bondpad | | | task (ii) |
| SQUARE | Xc | Yc | length | --"-- |
| POINT | X | Y | | --"-- |
| GROUP | | | | --"-- |
| task (iii): | | | | |
| INSTANCE | bondpad | −5.8810000 | 6.0100000 | (bond pad #1) |
| INSTANCE | bondpad | −5.6880000 | 6.0100000 | (bond pad #2) |
| --"-- | --"-- | . . . . . | . . . . . | . . . . . |
| --"-- | --"-- | . . . . . | . . . . . | . . . . . |
| INSTANCE | bondpad | −6.3280000 | 5.3840000 | (bondpad #299) |
| INSTANCE | bondpad | −6.3280000 | 5.5700000 | (bondpad #304) |

Figure 8:
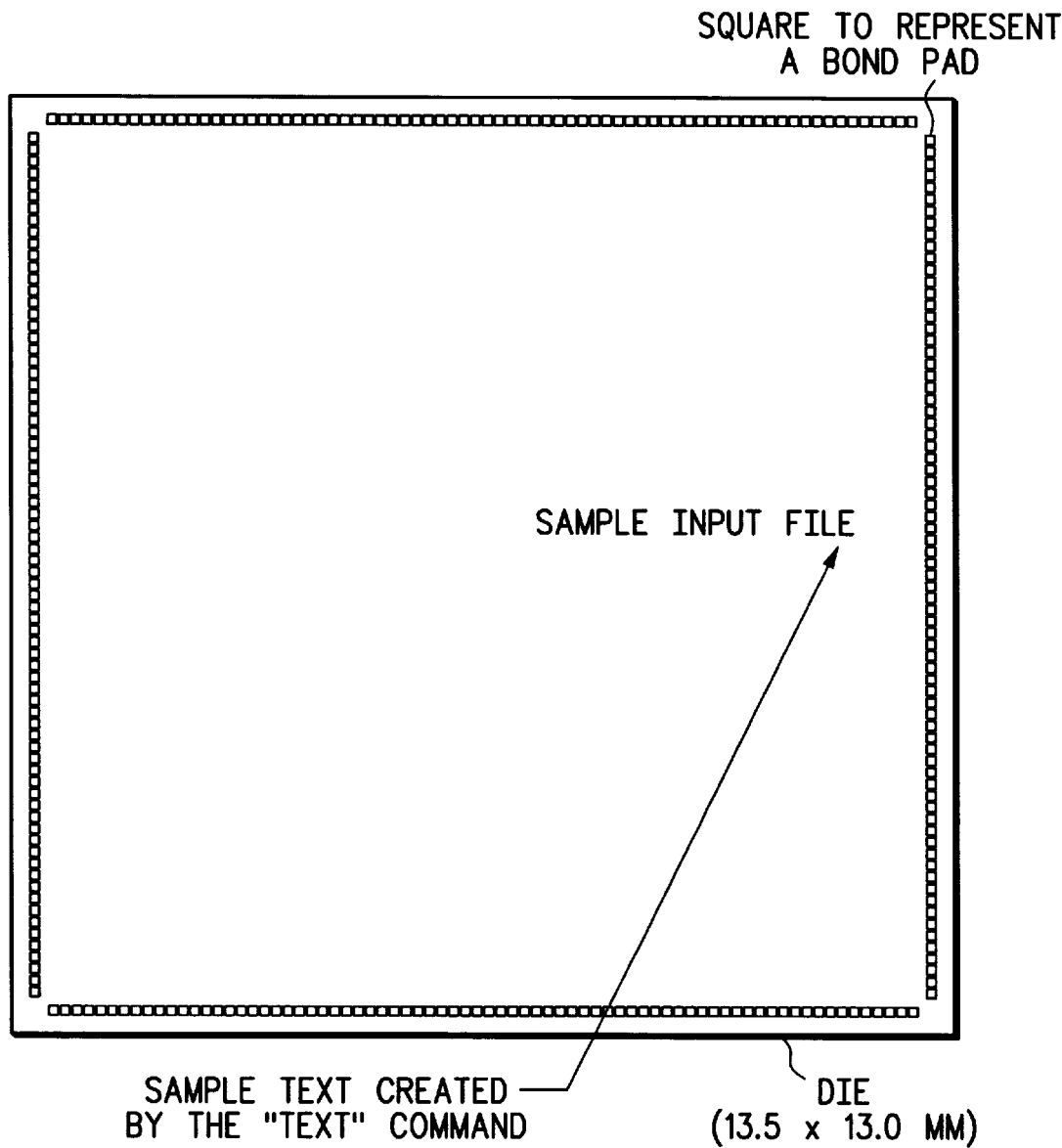
FIG. 8 illustrates a drawing created by reading in the neutral-format file generated by the program in Microfiche Appendix, in accordance with the method of the neutral-formatfile generator of FIG. 1.

Using a general purpose spreadsheet software which is available on any computer platform, these three tasks require less than 5 minutes to complete for this case study. The automatic neutral-file-format generator which runs on UNIX™ platforms then converts this design intent file into a neutral-format file in a matter of seconds. This neutral format file can then be imported into most CAD systems as the CAD input file used to generate drawings. A copy of the actual program used to generate the DXF™ output file is included in Microfiche Appendix. Additionally, a CAD drawing automatically produced by importing the output file generated by the method of the invention into a CAD program is shown in FIG. 8. As can be seen a die having 304 precisely drawn and located bond pads can be created in a matter of 5 minutes or less rather than the multiple hours as was done previously.

The foregoing description and illustrations contained herein demonstrate many of the advantages associated with the present invention. In particular, it has been revealed that a spreadsheet utility may be used to quickly convert a file containing design information into a design intent file. Moreover, the neutral-format file generator of the present invention then takes the design intent file and rewrites it into a DXF™ which can then be imported into most CAD programs to be read. Yet another advantage is that the present invention allows every step to be done electronically thus bypassing human inputs error as well as significantly reducing the amount of time needed to accomplish drawing tasks.

Thus it is apparent that there has been provided, in accordance with the invention, a method for converting a design intent into a neutral-file-format for CAD applications that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, other command identifiers may be defined and used as part of the language's syntax, such as triangle, curve, ellipse, etc. In addition, the invention is not limited to use in a leadframe design stage. Any application requiring a conversion of a text or spreadsheet format of parametric data into a neutral-file-format may take advantage of the present invention's method of conversion. Also, the neutral-file format is not limited to DXF™ but may encompass other standard neutral-file-formats. Furthermore, the method of the invention is not limited to a sequential or serial comparison of entities and groups. If parallel comparison were possible, it may be advantageous to use parallel comparison to save processing time. Additionally, application of the present invention is not at all limited to two-dimensional drawings. It is anticipated that three-dimensional applications may also utilize the method of the present invention. Therefore, it is intended that this invention encompasses all such variations and modifications falling within the scope of the appended claims.

I claim:

1. A method for creating a neutral-format file for a host computer, comprising the steps of:

provinding an electronic data file in a spreadsheet on a computer;

performing the following steps on the computer:

a) electronically expanding the spreadsheet to form an expanded spreadsheet; and b) inserting functional commands that are not mathematical operations into the expanded spreadsheet on the computer to convert the electronic data file into an input file containing a design-intent;

converting the input file containing the design-intent into an electronic neutral-format DXF output file compatible with a computer-aided-design (CAD) program in a host computer by electronically performing the functional commands in the input file.

2. The method of claim 1, wherein the step of providing the electronic data file is further characterized as providing said electronic data file containing parametric data to specify coordinates and dimensions of geometric features in a drawing.

3. The method of claim 2, wherein the step of inserting functional commands is further characterized as adding a command identifier selected from a group consisting of: point, line, die, square, circle, instance, text, and group, for every line of parametric data in the electronic data file.

4. The method of claim 2, wherein the step of electronically expanding the spreadsheet comprises:

adding a column in a far left position in the spreadsheet; and wherein the step of inserting functional commands comprises adding a command identifier in the column for every line of parametric data in the electronic data file.

5. The method of claim 4, wherein the step of converting the input file is further characterized as comprising the steps of:

reading the command identifier in the column in the far left position of the spreadsheet;

counting said identifier command;

reading the line of parametric data corresponding to the instructional command, wherein the steps of reading the command identifier, counting said command identifier, and reading the line of parametric data are performed sequentially in a do-loop until the input file is completely read; and performing the functional command by identifying the command identifier to convert the input file into a neutral-format DXF output file which is in a line-item format.

6. A method for generating a drawing having a given layout position for a given physical feature on the drawing, comprising the steps of:

providing on a computer an electronic data file containing parametric data in a spreadsheet to specify coordinates and dimensions of the given physical feature;

electronically, on the computer, inserting a column in a far left position in the spreadsheet to form an expanded spreadsheet;

inserting a functional command in the column at the far left position in the expanded spreadsheet, using a command identifier, for every line of parametric data in the electronic data file to form an electronic input file, wherein the functional command is not a mathematical operation;

electronically performing the functional command in the electronic input file to write the parametric data into an electronic neutral-format DXF output file that can be read by a CAD package; and electronically loading said electronic neutral-format DXF output file into a computer-aided-drawing package on a host computer to generate the drawing having the physical feature automatically drawn in the given layout position.

7. The method of claim 6, wherein the step of electronically performing the functional command for every line of parametric data is further characterized as comprising the steps of:

reading the functional command identifying the command identifier in the column in the far left position of the expanded spreadsheet;

counting said command identifier;

reading the parametric data corresponding to the functional command, wherein the steps of reading the command identifier, counting said command identifier, and reading the parametric data are performed sequentially in a do-loop until the electronic input file is completely read; and converting the electronic input file into a electronic neutral-format DXF output file which is in a line-item format.

8. The method of claim 6, wherein the step of inserting the functional command uses an identifier selected from a group of command identifiers consisting of: point, line, die, square, circle, instance, text, and group.

9. The method of claim 6, wherein the step of inserting the functional command is further characterized as inserting an entity command having a single line of instruction.

10. The method of claim 6, wherein the step of inserting the functional command is further characterized as inserting a group command having a plurality of lines of instructions.

11. The method of claim 10, wherein the step of inserting the group command is further characterized as inserting a nested entity command having a single line of instruction.

12. The method of claim 10, wherein the step of inserting the group command is further characterized as inserting a nested group command having a plurality of lines of instructions.

13. A method for creating a neutral-format file on a computer, comprising the steps of:

providing an electronic data file in a spreadsheet format, the electronic data file containing design information;

electronically expanding the spreadsheet format by inserting a column;

adding command identifiers to the electronic data file in the column that was inserted to form an electronic input file; and generating an electronic neutral-format output file from the electronic input file by performing the following steps:

a) reading and identifying the command identifiers in the electronic input file in a do-loop until the electronic input file is completely read;

b) keeping a counter of each type of command identifiers encountered in the do-loop;

c) reading the design information; and d) converting the electronic input file in the spreadsheet format into the electronic neutral-format DXF output file having single-line code instructions that is compatible with a CAD program, wherein each command identifier is followed by associated design information to allow automatic layout of the design information originally contained in the electronic data file.

14. The method of claim 13, wherein the step of adding command identifiers selects from a group consisting of: point, line, die, square, circle, instance, text, and group.

15. The method of claim 13, wherein the step of adding command identifiers adds an entity command having a single line of instruction.

16. The method of claim 13, wherein the step of adding command identifiers adds a group command having a plurality of lines of instructions.

17. The method of claim 16, wherein the step of adding the group command adds a nested entity command having a single line of instruction.

18. The method of claim 16, wherein the step of adding the group command comprises a nested group command having a plurality of lines of instructions.

19. The method of claim 13, wherein the step of keeping a counter is further characterized as keeping a first counter for counting entity commands, a second counter for counting group commands, and a third counter for counting group members.

* * * * *